United States Patent
Lin et al.

(10) Patent No.: US 11,315,829 B2
(45) Date of Patent: Apr. 26, 2022

(54) AMORPHOUS LAYERS FOR REDUCING COPPER DIFFUSION AND METHOD FORMING SAME

(71) Applicant: Taiwan Semiconductor Manufacturing Co., Ltd., Hsinchu (TW)

(72) Inventors: Jyh-Nan Lin, Hsinchu (TW); Chia-Yu Wu, Hsinchu (TW); Kai-Shiung Hsu, Hsinchu (TW); Ding-I Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/890,413

(22) Filed: Jun. 2, 2020

(65) Prior Publication Data

US 2021/0066122 A1 Mar. 4, 2021

Related U.S. Application Data

(60) Provisional application No. 62/891,688, filed on Aug. 26, 2019.

(51) Int. Cl.
*H01L 21/768* (2006.01)
*H01L 21/02* (2006.01)
(Continued)

(52) U.S. Cl.
CPC .......... *H01L 21/76829* (2013.01); *C23F 1/12* (2013.01); *H01L 21/02178* (2013.01);
(Continued)

(58) Field of Classification Search
CPC ......... H01L 21/76829; H01L 21/76802; H01L 21/02178; H01L 23/53295;
(Continued)

(56) References Cited

U.S. PATENT DOCUMENTS 10,985,011 B2 4/2021 Hsueh et al.
2005/0148147 A1* 7/2005 Keating ............ H01L 21/30608
438/299

(Continued)

FOREIGN PATENT DOCUMENTS

CN 106876325 A 6/2017
JP H05291560 A 11/1993
(Continued)

OTHER PUBLICATIONS

Auner, G.W., et al., "Microstructure of low temperature grown AlN thin films on Si(111)," Journal of Applied Physics, vol. 85, No. 11, Jun. 1, 1999, pp. 7879-7883.

*Primary Examiner* — Karen Kusumakar
(74) *Attorney, Agent, or Firm* — Slater Matsil, LLP

(57) ABSTRACT

A method includes depositing an etch stop layer over a first conductive feature, performing a first treatment to amorphize the etch stop layer, depositing a dielectric layer over the etch stop layer, etching the dielectric layer to form an opening, etching-through the etch stop layer to extend the opening into the etch stop layer, and filling the opening with a conductive material to form a second conductive feature.

20 Claims, 14 Drawing Sheets

(51) Int. Cl.
  *H01L 23/532* (2006.01)
  *H01L 23/522* (2006.01)
  *C23F 1/12* (2006.01)
(52) U.S. Cl.
  CPC .... *H01L 21/76802* (2013.01); *H01L 23/5226* (2013.01); *H01L 23/53209* (2013.01); *H01L 23/53295* (2013.01)
(58) Field of Classification Search
  CPC ........... H01L 23/53209; H01L 23/5226; H01L 21/76849; H01L 21/28562; H01L 21/76832; H01L 21/76834; H01L 21/76826; H01L 23/53238; H01L 21/02351; H01L 21/02356; H01L 21/02274; H01L 21/0228; H01L 21/76805; H01L 21/76877; H01L 21/7685; H01L 21/76862; H01L 21/022; H01L 21/76807; C23F 1/12; H05K 3/00
  See application file for complete search history.

(56) References Cited

U.S. PATENT DOCUMENTS

| | | | |
|---|---|---|---|
| 2016/0111373 A1* | 4/2016 | Xie | H01L 21/7682 257/638 |
| 2016/0197136 A1 | 7/2016 | Oh et al. | |
| 2017/0278742 A1 | 9/2017 | Chen et al. | |
| 2018/0315704 A1 | 11/2018 | Chen et al. | |
| 2019/0067089 A1 | 2/2019 | Yang et al. | |
| 2019/0067093 A1 | 2/2019 | Chang et al. | |
| 2020/0105672 A1* | 4/2020 | Madhavan | H01L 21/02178 |
| 2020/0373199 A1* | 11/2020 | Cheng | H01L 21/76808 |

FOREIGN PATENT DOCUMENTS

| | | |
|---|---|---|
| JP | 2007134425 A | 5/2007 |
| JP | 2009302570 A | 12/2009 |
| TW | 201919248 A | 5/2019 |

* cited by examiner

AMORPHOUS LAYERS FOR REDUCING COPPER DIFFUSION AND METHOD FORMING SAME

PRIORITY CLAIM AND CROSS-REFERENCE

This application claims the benefit of the U.S. Provisional Application No. 62/891,688, filed Aug. 26, 2019, and entitled "Amorphous Layers for Reducing Copper Diffusion and Method Forming Same," which application is hereby incorporated herein by reference.

BACKGROUND

High-density integrated circuits, such as Very Large Scale Integration (VLSI) circuits, are typically formed with multiple metal interconnects to serve as three-dimensional wiring line structures. The purpose of the multiple interconnects is to properly link densely packed devices together. With increasing levels of integration, a parasitic capacitance effect between the metal interconnects, which leads to RC delay and cross-talk, increases correspondingly. In order to reduce the parasitic capacitance and increase the conduction speed between the metal interconnections, low-k dielectric materials are commonly employed to form Inter-Layer Dielectric (ILD) layers and Inter-Metal Dielectric (IMD) layers.

Metal lines and vias are formed in the IMD layers. A formation process may include forming an etch stop layer over first conductive features, and forming a low-k dielectric layer over the etch stop layer. The low-k dielectric layer and the etch stop layer are patterned to form a trench and a via opening. The trench and the via opening are then filled with a conductive material, followed by a planarization process to remove excess conductive material, so that a metal line and a via are formed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
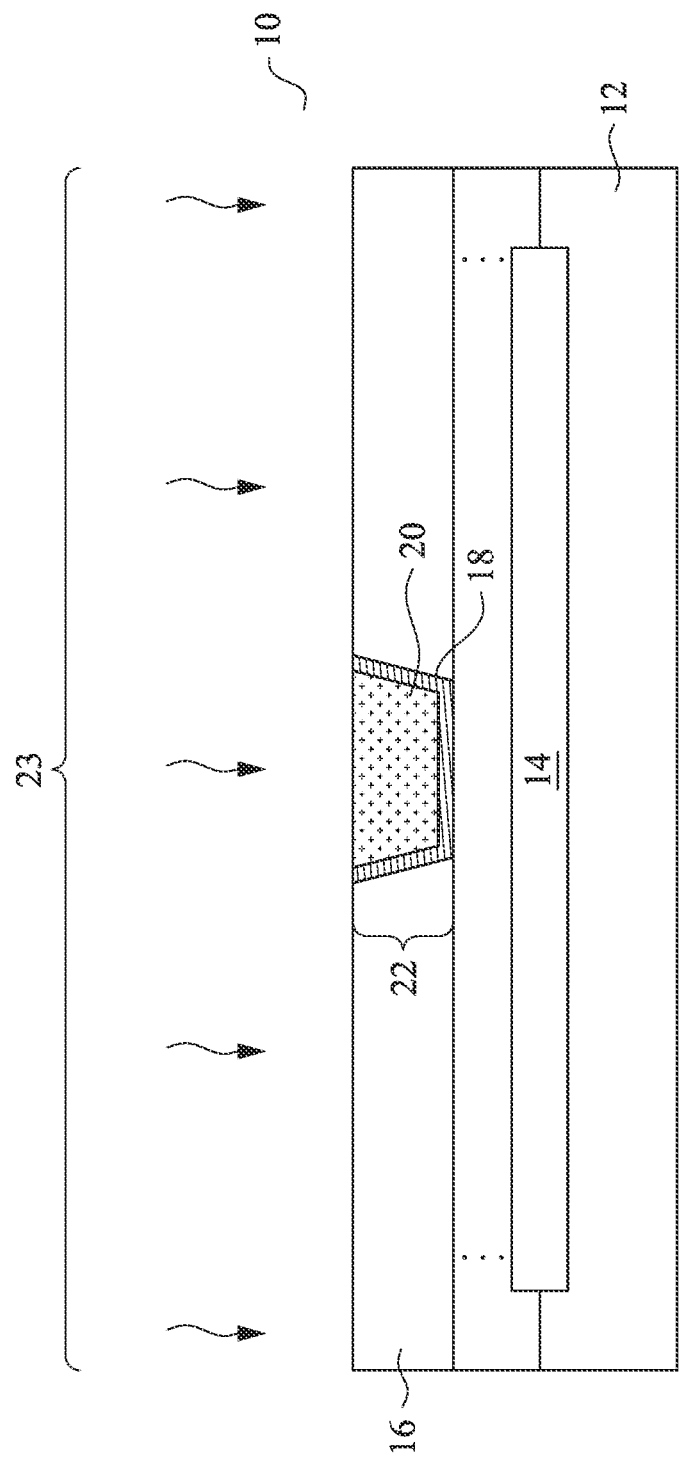
FIGS. 1 through 12 illustrate the cross-sectional views of intermediate stages in the formation of an interconnect structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An interconnect structure and the method of forming the same are provided in accordance with some embodiments. The intermediate stages in the formation of the interconnect structure are illustrated in accordance with some embodiments. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order. In accordance with some embodiments of the present disclosure, the formation of an interconnect structure includes depositing a metal cap over a first conductive feature, performing a first treatment to amorphize the metal cap, depositing an etch stop layer over the metal cap, and performing a second treatment to amorphize the etch stop layer. A low-k dielectric layer is then formed over the etch stop layer, followed by etching the low-k dielectric layer and the etch stop layer to form a trench and a via opening. With the metal cap and the etch stop layer being amorphous, it is more difficult for the metal such as copper in the first conductive feature to diffuse upwardly into the etch stop layer and the overlying low-k dielectric layer. Since the diffused copper may cause difficulty in the etching of the low-k dielectric layer and the etch stop layer, making amorphous metal cap and etch stop layer to be amorphous improves the etching processes.

FIGS. 1 through 12 illustrate the cross-sectional views of intermediate stages in the formation of an interconnect structure in accordance with some embodiments of the present disclosure. The corresponding processes are also reflected schematically in the process flow shown in FIG. 14.

FIG. 1 illustrates a cross-sectional view of a portion of wafer 10, which may also be a portion of a device die. In accordance with some embodiments of the present disclosure, wafer 10 is a device wafer including active devices such as transistors and/or diodes, and possibly passive devices such as capacitors, inductors, resistors, and/or the like. In accordance with alternative embodiments, wafer 10 is an interposer wafer, which is free from active devices, and may include or may be free from passive devices.

In accordance with some embodiments of the present disclosure, wafer 10 includes semiconductor substrate 12. Semiconductor substrate 12 may be formed of crystalline silicon, crystalline germanium, silicon germanium, and/or a III-V compound semiconductor such as GaAsP, AlInAs, AlGaAs, GaInAs, GaInP, GaInAsP, or the like. Semiconductor substrate 12 may also be a bulk silicon substrate or a Silicon-On-Insulator (SOI) substrate. Shallow Trench Isolation (STI) regions (not shown) may be formed in semiconductor substrate 12 to isolate the active regions in semiconductor substrate 12. Although not shown, through-vias may be formed to extend into semiconductor substrate 12, wherein the through-vias are used to electrically inter-couple the features on opposite sides of semiconductor substrate 12. Active devices 14, which may include transistors, may be formed at the top surface of semiconductor substrate 12. There may be, or may not be, passive device formed in and/or over semiconductor substrate 12.

Further illustrated in FIG. 1 is dielectric layer 16, which may be an Inter-Layer Dielectric (ILD) or an Inter-Metal Dielectric (IMD) layer. In accordance with some embodiments of the present disclosure, dielectric layer 16 is formed of a low-k dielectric material having a dielectric constant (k-value) lower than about 3.0, lower than about 2.5, or even lower. IMD layer 16 may be formed of Black Diamond (a registered trademark of Applied Materials), a carbon-containing low-k dielectric material (such as SiOC), Hydrogen SilsesQuioxane (HSQ), MethylSilsesQuioxane (MSQ), or the like. In accordance with some embodiments of the present disclosure, the formation of IMD layer 16 includes depositing a porogen-containing dielectric material and then performing a curing process to drive out the porogen, and hence the remaining IMD layer 16 is porous. Dielectric layer 16 may also be formed of silicon oxide, Phospho-Silicate Glass (PSG), Boro-Silicate Glass (BSG), Boron-Doped Phospho-Silicate Glass (BPSG), Undoped Silicate Glass (USG), or like.

Figure 14:
FIG. 14 illustrates a process flow for forming the interconnect structure in accordance with some embodiments.

Conductive feature 22 is formed in dielectric layer 16. The respective process is illustrated as process 202 in the process flow 200 as shown in FIG. 14. In accordance with some embodiments, conductive feature 22 is or comprises a metal line. In accordance with some embodiments, conductive feature 22 is or comprises a contact plug. Conductive feature 22 may include a diffusion barrier layer 18 and a copper-containing material 20 over the respective diffusion barrier layer 18. Diffusion barrier layer 18 may be formed of titanium, titanium nitride, tantalum, tantalum nitride, or the like, and has the function of preventing copper in copper-containing material 20 from diffusing into dielectric layer 16. Conductive feature 22 may have a single damascene structure, a dual damascene structure, or the like. The formation of conductive feature 22 may include etching dielectric layer 16 to form a trench, depositing a blanket diffusion barrier layer extending into the trench, depositing a conductive material to fully fill the trench, and performing a planarization process. The portion of the conductive material and the blanket diffusion barrier layer outside of the trench are removed by the planarization process, hence leaving conductive feature 22 in dielectric layer 16. The copper-containing material 20 may comprise substantially pure copper (for example, with the copper having atomic percentage greater than 90 percent) or a copper alloy.

Next, a treatment process 23 is performed to form copper nitride (CuN) on the surface of conductive material 20. In accordance with some embodiments, treatment process 23 is performed by conducting at least one nitrogen-containing gas, such as ammonia ($NH_3$) and/or nitrogen ($N_2$) to wafer 10, so that a thin layer of copper nitride is formed. The treatment process 23 may include a plasma treatment. In accordance with some example embodiments, a process gas including $NH_3$ is conducted. The flow rate of $NH_3$ may be in the range between about 1,200 sccm and about 1,800 sccm. A High-Frequency Radio-Frequency (HFRF) power, for example, with a frequency of about 13.56 MHz, is applied. The HFRF power is used for generating plasma from the process gas, may be in the range between about 300 watts and about 600 watts. The treatment process 23 may also include a thermal treatment process (without plasma) at an elevated temperature. The elevated temperature of wafer 10 may be in the range between about 300° C. and about 400° C. In accordance with alternative embodiments, the treatment process 23 is performed with plasma being turned on, and at the elevated temperature.

Figure 2:
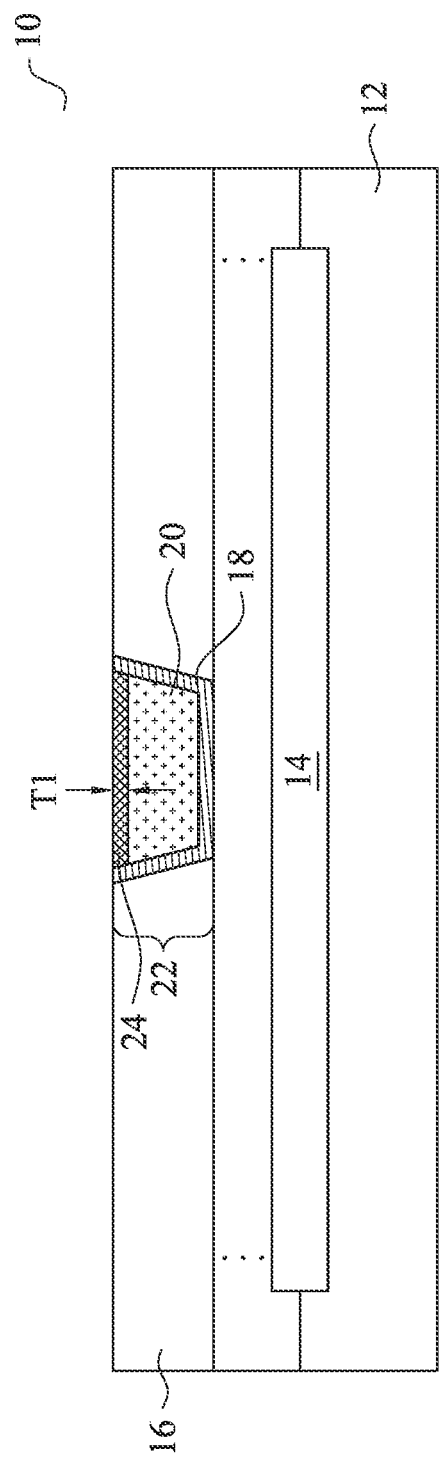

Next, the conduction of ammonia is stopped, and a cobalt-containing precursor is conducted to wafer 10. Accordingly, cobalt is deposited on the treated surface of conductive material 20, which includes a thin layer of copper nitride. Copper nitride is turned into cap layer 24, which comprises cobalt nitride (CoN). The copper in copper nitride diffuses through CoN, for example, when temperature is higher than about 350° C. into copper-containing material 20. The resulting structure is shown in FIG. 2. Cap layer 24, which is a metal cap, is thus formed. The respective process is illustrated as process 204 in the process flow 200 as shown in FIG. 14. The cobalt-containing precursor may be or comprise an organic precursor, which may include at least one of $N_2$, $NH_3$, $Co(C_5H5)_2$, $Co(C_5H_5)(Co)_2$, or the like. The deposition of cobalt may be achieved through Chemical Vapor Deposition (CVD), Plasma Enhanced Atomic Layer Deposition (PEALD), or the like. The conduction of the cobalt-containing precursor may then be stopped.

Figure 11:
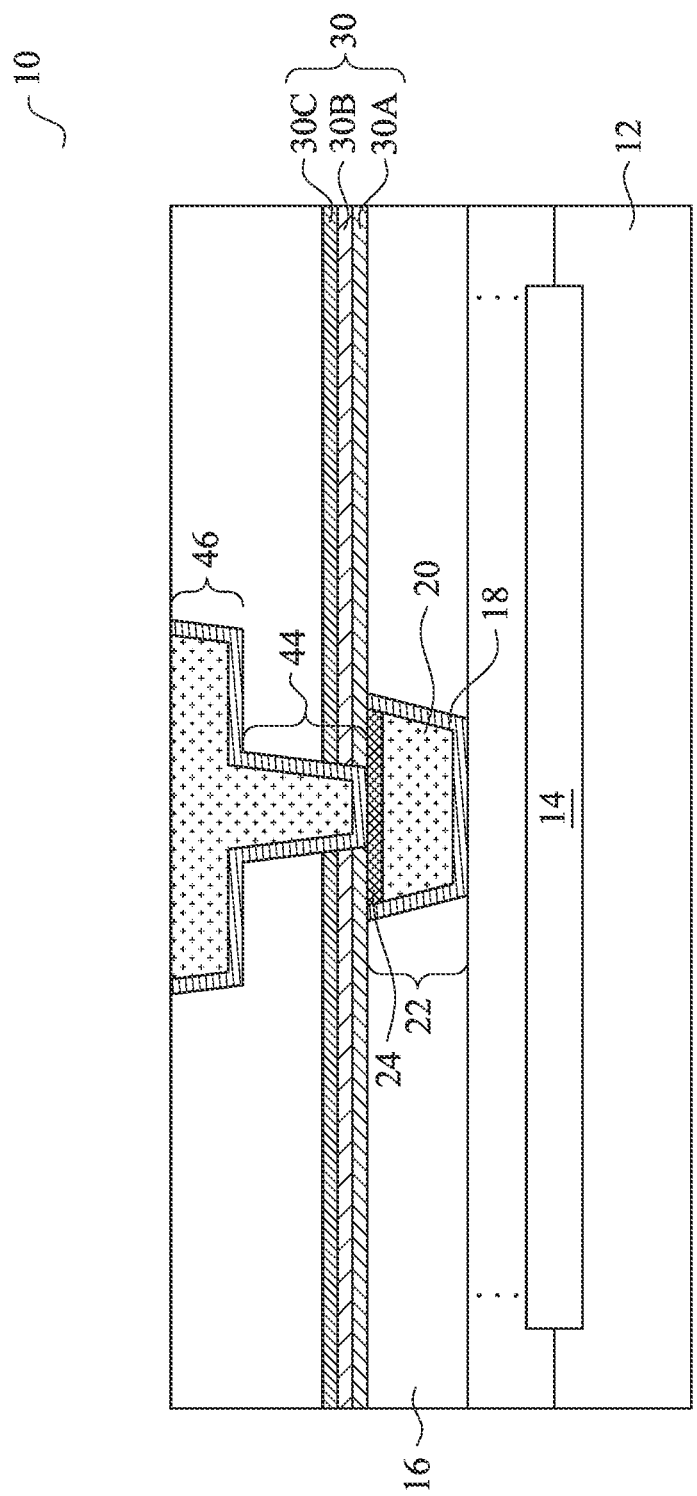

In accordance with some embodiments, the $NH_3$ treatment process and the cobalt deposition process are repeated with a plurality of cycles, with each of the cycles including an $NH_3$ treatment process followed by the introduction of a cobalt-containing precursor. Purging processes may be performed between the conduction of ammonia and the cobalt-containing precursor. In accordance with some embodiments, the $NH_3$ treatment is performed without either one or both of nitrogen ($N_2$) and hydrogen ($H_2$) in the respective process gas. As a result of each of the plurality of cycles, a new layer of CoN is formed. The cycles may be repeated until the thickness T1 of cap layer 24 is in a selected range. It is appreciated that thickness T1 cannot be too high or too small. If thickness T1 is too high, for example, greater than about 40 Å, the resistance caused by cap layer 24 (which has a high resistivity) is too high, resulting in in poor electrical connection between conductive feature 22 and the subsequently formed via 44 (FIG. 11). If thickness T1 is too small, for example, smaller than about 20 Å, the function of cap layer 24 for blocking copper diffusion is compromised. Accordingly, thickness T1 may be selected to be between about 20 Å and about 40 Å.

Since cobalt-containing precursor may comprise organic substance, the $NH_3$ treatment processes may also help to remove the organic material introduced into cap layer 24 by the organic cobalt-containing precursor. Furthermore, the $NH_3$ treatment process 23 and the cobalt deposition process in the subsequent cycles add hydrogen atoms into cap layer 24, and may result in the removal of oxygen atoms from cap layer 24 and the underlying conductive feature 22.

In accordance with some embodiments, cap layer 24, instead of being formed of CoN, may also be formed of other materials that have high etching selectivity relative to the overlying etch stop layer 30A (FIG. 4), and have good adhesion to etch stop layer 30A. For example, layer 24 may be formed of tantalum nitride, tantalum carbo-nitride, or the like. Throughout the description, layer 24 is referred to as cap layer 24.

Cap layer 24 may have a polycrystalline structure, which includes grains that have grain boundaries. The copper atoms in conductive feature 22 may diffuse upwardly along the grain boundaries to overlying layers that will be formed subsequently. Accordingly, after the deposition of cap layer 24, a treatment process is performed to convert the polycrystalline cap layer 24 into an amorphous layer. The conversion of the polycrystalline cap layer 24 into the amorphous layer has two functions. Firstly, the subsequently deposited etch stop layer 30A (FIG. 5) is more likely to be amorphous when it is deposited on the amorphous cap layer 24. Secondly, the amorphous cap layer 24 has better ability of blocking copper from diffusing through it.

Figure 3:
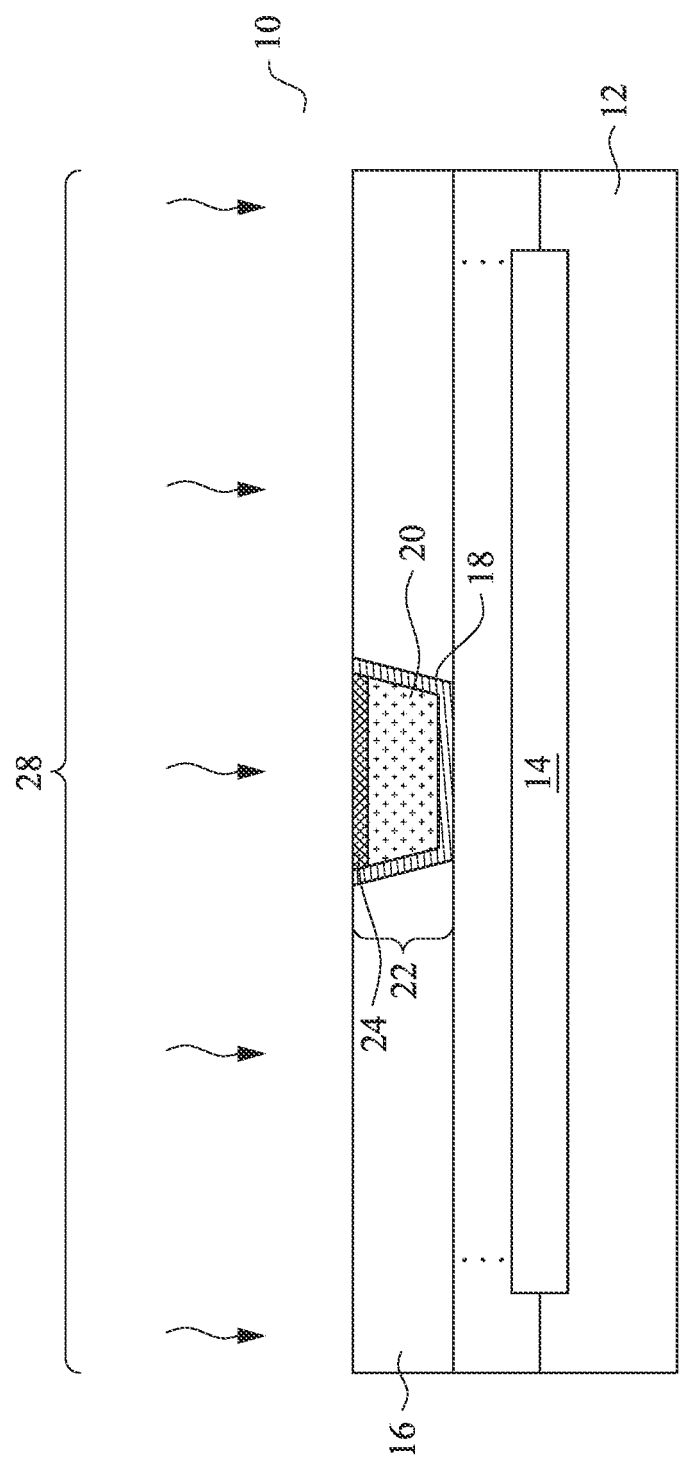

FIG. 3 illustrates the treatment process 28 for converting the polycrystalline cap layer 24 into an amorphous layer, which is also referred-to using reference numeral 24. The respective process is illustrated as process 206 in the process flow 200 as shown in FIG. 14. In accordance with some embodiments of the present disclosure, the treatment process 28 is performed using a nitrogen-containing process gas such as $NH_3$. Other gases such as helium (He) may also be added. Nitrogen atoms in the process gas may help the formation of the amorphous structure. The hydrogen atoms in the process gas may help to remove the oxygen in cap layer 24 and the underlying conductive material 20. The amount of hydrogen in the process gas, however, is desirable to be not excessive. This means that if $NH_3$ is used alone, the ratio of hydrogen-to-nitrogen in the process gas may be higher than desired. In accordance with some embodiments, nitrogen ($N_2$) is added into the process gas to reduce the atomic ratio of hydrogen-to-nitrogen. In accordance with some embodiments, the flow rate ratio of nitrogen to ammonia is adjusted, so that the hydrogen-to-nitrogen atomic ratio H:N is in the range between about 1 and about 3. The $NH_3$ may have a flow rate in the range between about 50 sccm and about 500 sccm. The $N_2$ may have a flow rate in the range between about 1,000 sccm and about 3,000 sccm. In accordance with alternative embodiments, nitrogen ($N_2$) is not added.

In accordance with some embodiments, the treatment process 28 comprises a plasma treatment, which may be a direct plasma treatment process, with the plasma being generated in the same process chamber is which wafer 10 is treated. The direct plasma treatment process may include applying both of an HFRF power and a Low-Frequency Radio-Frequency (LFRF) power, for example, with the LFRF power having a frequency of about 350 KHz. The HFRF power is used for ionization and to generate plasma, and the LFRF power is used for bombarding cap layer 24 for amorphization. In accordance with some embodiments of the present disclosure, the HFRF power is in the range between about 400 watts and about 800 watts. The LFRF power may be in the range between about 50 watts and about 150 watts. In accordance with alternative embodiments, the treatment process 28 comprises a remote plasma treatment process, in which the plasma is generated in a different environment than the chamber of wafer 10. Accordingly, the LFRF power is not applied.

Figure 4:
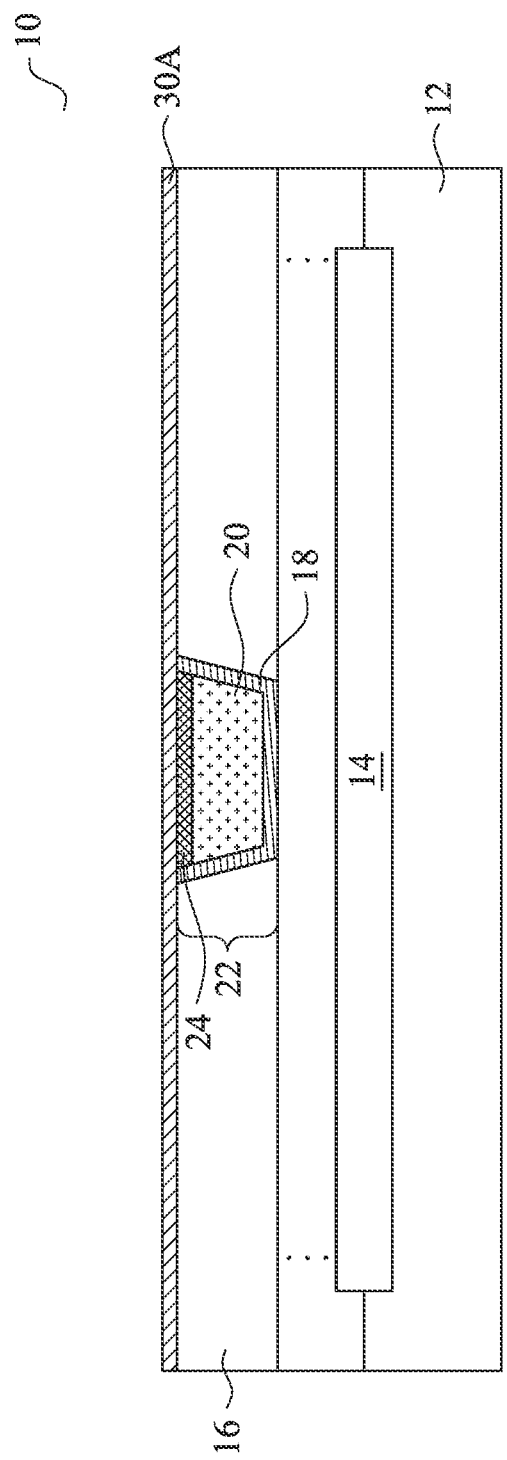

FIG. 4 illustrates the deposition of etch stop layer 30A in accordance with some embodiments. The respective process is illustrated as process 208 in the process flow 200 as shown in FIG. 14. Etch stop layer 30A may be formed of a metal nitride that has good adhesion to the underlying cap layer 24 and dielectric layer 16. For example, etch stop layer 30A may be formed of aluminum nitride (AlN), aluminum oxynitride (AlNO), manganese nitride ($Mn_3N_2$), gallium nitride (GaN), Aluminum gallium nitride (AlGaN), or the like. In subsequent paragraphs, etch stop layer 30A is alternatively referred to as aluminum nitride layer 30A, while etch stop layer 30A may be formed of other materials. It is appreciated, however, if etch stop layer 30A is not an aluminum nitride layer, the subsequently mentioned process details for deposition and treatment may be different than discussed. Etch stop layer 30A cannot be too thick or too thin. If too thick, when etching-through etch stop layer 30A in subsequent processes, undercuts may be generated. When too thin, etch stop layer 30A cannot effectively stop the etching of the overlying layers. In accordance with some embodiments, the thickness of etch stop layer 30A may be in the range between about 23 Å and about 50 Å. In accordance with some embodiments, etch stop layer 30A is formed using Atomic Layer Deposition (ALD), Plasma Enhance Atomic Layer Deposition (PEALD), or the like. The precursor may include a nitrogen-containing process gas such as $NH_3$ and an aluminum-containing process gas such as Trimethyl Aluminum (TMA) ($Al_2(CH_3)_6$) or the like. In the deposition process, the nitrogen-containing process gas and the aluminum-containing process gas may be conducted and then purged alternatingly to grow aluminum nitride atomic layers layer-by-layer.

The temperature of wafer 10 during the deposition of aluminum nitride layer 30A is selected to be in certain range. It is appreciated that the temperature of wafer 10 affects the deposition rate. If the temperature is too low (for example, lower than about 300° C.), the deposition rate (the increased thickness per unit time) may be too low, and it is unrealistic for mass production. If the temperature is too high (for example, higher than about 380° C.), the resulting aluminum nitride layer 30A is crystalline (such as polycrystalline), which is undesirable. In accordance with some embodiments of the present disclosure, the temperature of wafer 10 during the deposition of aluminum nitride layer 30A is selected as being in the range between about 300° C. and about 380° C. to avoid the aforementioned problems.

The deposited aluminum nitride layer 30A may (or may not) include some crystalline structures such as polycrystalline structures, which include grains therein. Some grains may be connected to each other, while some grains may be buried in amorphous structures. The copper in conductive feature 22 may also diffuse upwardly along the grain boundaries to overlying layers that will be formed subsequently. Accordingly, after the deposition of aluminum nitride layer 30A, a post treatment process is performed to convert the polycrystalline structures (if any) in aluminum nitride layer 30A into amorphous structures, so that the entire aluminum nitride layer 30A is amorphous. Since amorphous aluminum nitride layer 30A does not have grain boundaries, it has better ability to block copper from diffusing through.

Figure 5:
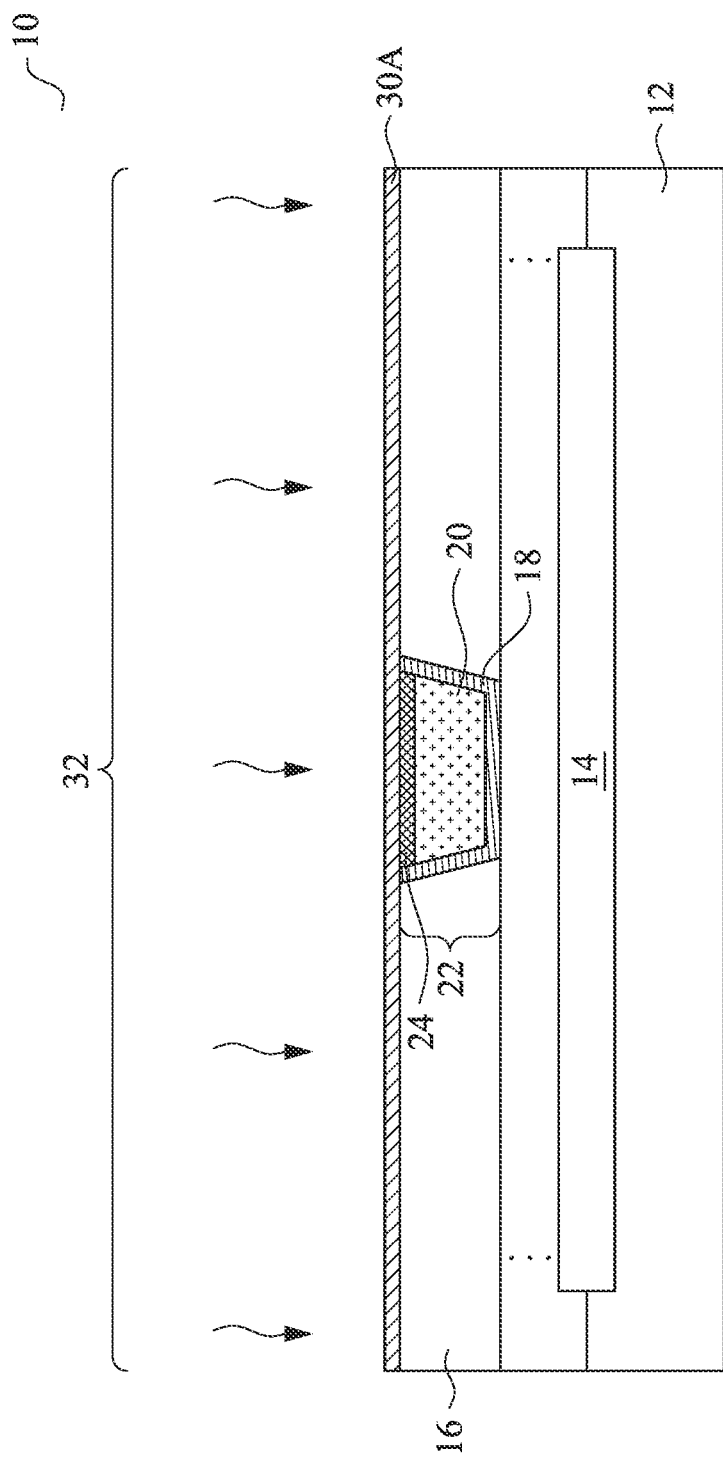

Referring to FIG. 5, treatment process 32 is performed to convert the polycrystalline structures in aluminum nitride layer 30A into amorphous structures. The resulting aluminum nitride layer is also referred to as 30A. The respective process is illustrated as process 210 in the process flow 200 as shown in FIG. 14. In accordance with some embodiments of the present disclosure, the treatment process 32 is performed using a process gas selected from $NH_3$, $N_2$, or combination thereof. Other gases such as argon may also be added. In the treatment process 32, aluminum nitride layer 30A is bombarded. The bombardment destroys the crystalline structure. Also, with hydrogen and nitrogen atoms being in the process gas (such as in $NH_3$), hydrogen and nitrogen may be added into aluminum nitride layer 30A. Accordingly, aluminum nitride layer 30A may comprise hydrogen doped therein as a result of the treatment process 32. In accordance with some embodiments, aluminum nitride layer 30A has a hydrogen atomic percentage in the range between about 1 percent and about 3 percent.

The treatment process 32 also has the effect of changing the aluminum-to-nitrogen atomic ratio (referred to as Al:N atomic ratio hereinafter), which also affects whether the resulting aluminum nitride layer 30A has crystalline or amorphous structures or not. For example, an ideal crystalline aluminum nitride layer has an atomic ratio Al:N close to 1:1. The addition of nitrogen atoms destroys this balance. For example, with nitrogen being used for the bombardment, nitrogen atoms bond with aluminum, so that one aluminum atom may be cross-linked with more than one nitrogen atom (which may further bond with hydrogen atoms). It is thus easier to have amorphous structures to be formed. Furthermore, with one aluminum atom being bonded to more than one nitrogen atoms, the re-crystallization of aluminum nitride layer 30A is prevented even if the subsequent temperature is high enough for recrystallization in subsequent processes. In addition, since the added nitrogen atoms may further be bonded with hydrogen atoms, hydrogen is also added into aluminum nitride layer 30A by the treatment process 32.

In accordance with some embodiments of the present disclosure, during treatment process 32, the $NH_3$ gas (when used) may have a flow rate in the range between about 50 sccm and about 500 sccm. The $N_2$ gas (when used) may have a flow rate in the range between about 1,000 sccm and about 3,000 sccm. The temperature of wafer 10 during treatment process 32 may be in the range between about 340° C. and about 400° C.

In accordance with some embodiments, the treatment process 32 comprises a plasma treatment, which may be a direct plasma process, with the plasma being generated in the same process chamber is which wafer 10 is treated. Plasma treatment process 32 is performed using both of an HFRF power and an LFRF power. The HFRF power is used for ionization and to generate plasma, and the LFRF power is used for bombarding aluminum nitride layer 30A for amorphization purpose. In accordance with some embodiments of the present disclosure, the HFRF power is in the range between about 400 watts and about 800 watts.

The LFRF power is selected to be in certain range. If the LFRF power is too low (for example, lower than about 90 watts), nitrogen ions may not be effectively doped into aluminum nitride layer 30A. If the LFRF power is too high (for example, higher than about 135 watts), there may be severe plasma-induced damage to the structures underlying aluminum nitride layer 30A. In accordance with some embodiments of the present disclosure, the LFRF power is selected as being in the range between about 90 watts and about 135 watts to avoid the aforementioned problems.

Figure 6:
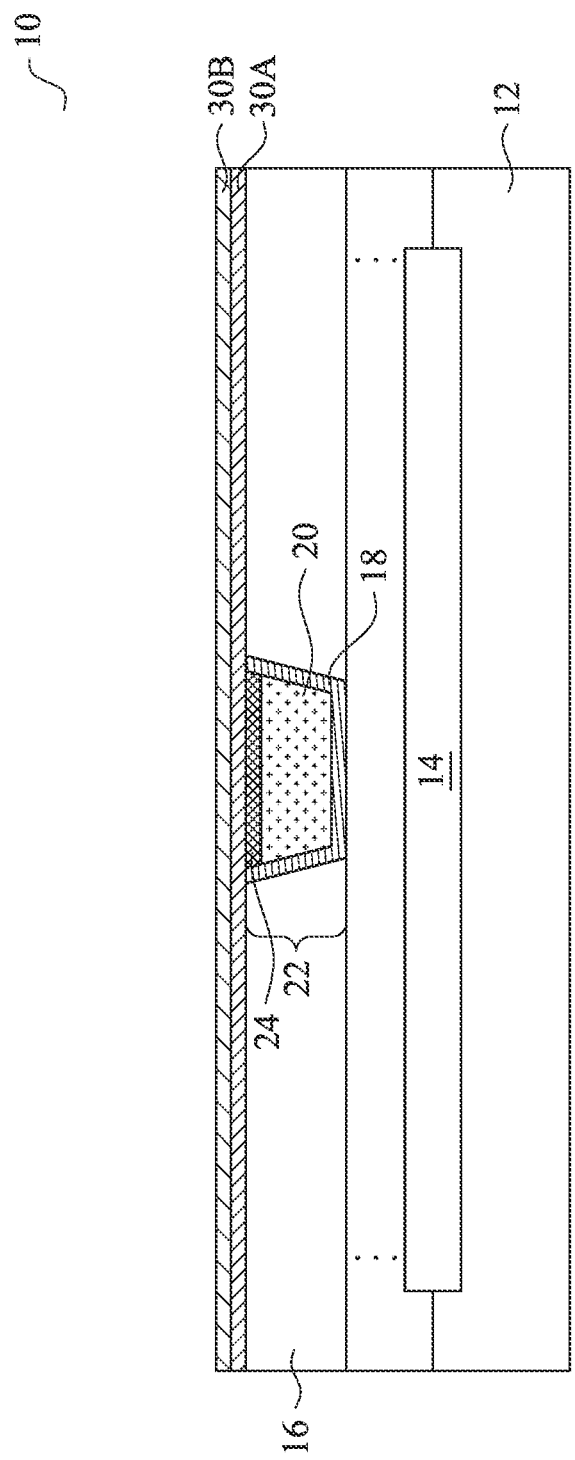

FIG. 6 illustrates the deposition of etch stop layer 30B in accordance with some embodiments. The respective process is illustrated as process 212 in the process flow 200 as shown in FIG. 14. Etch stop layer 30B may be formed of oxygen-doped (silicon) carbide (ODC), which is also known as silicon oxy carbide (SiOC). Etch stop layer 30B may also be formed of another material such as Nitrogen-Doped silicon Carbide (NDC), SiC, or the like. The deposition method may be PECVD or another method such as High-Density Plasma CVD (HDPCVD), ALD, chemical vapor deposition (CVD), or the like. The thickness of etch stop layer 30B may be in the range between about 23 Å and about 50 Å.

The precursors for forming etch stop layer 30B depend on the desired composition of etch stop layer 30B, and may include silicon (Si), carbon (C), hydrogen (H), nitrogen (N), oxygen (O), boron (B), and/or the like. In accordance with some embodiments, the precursors include a gas selected from 1-methylsilane ($Si(CH)H_3$, also known as 1MS), 2-methylsilane ($Si(CH)_2H_2$, also known as 2MS), 3-methylsilane ($Si(CH)_3H$, also known as 3MS), 4-methylsilane ($Si(CH)_4$, also known as 4MS), or combinations thereof. Inactive gases such as He, $N_2$, Ar, Xe, and the like may be used as ambient gases. If ODC is to be formed, carbon dioxide ($CO_2$) may also be added to provide oxygen. If NDC is to be formed, $NH_3$ may be added to provide nitrogen. Further, the precursors may include boron-containing gases such as $B_2H_6$, $BH_3$, or combinations thereof to provide boron in the resulting etch stop layer 30B.

In addition to the above-discussed precursors, one or more carbon-source gas may be added to increase the carbon content in the resulting etch stop layer 30B. The carbon-source gas may be a carbon-rich source, which means that the atomic percentage of carbon in the carbon-source gas is high, for example, greater than about 10 percent, or greater than about 20, or 30 percent. In an example embodiment, the carbon-source gas is a carbon-hydrogen containing gas selected from $C_2H_4$, $C_2H_6$, and combinations thereof. With the additional carbon provided by the carbon-source gas, the carbon percentage in the resulting etch stop layer 30B is increased, and the property of etch stop layer 30B is improved. In accordance with some embodiments, the ratio of the flow rate of the carbon source gas to the flow rate of all 1MS/2MS/3MS/4MS gases is greater than about 2 to 4.

In accordance with some embodiments, the formation of etch stop layer 30B is performed in a chamber using, for example, PECVD, wherein the temperature of wafer 10 may be between about 300° C. and about 500° C., and the chamber pressure may be between about 2 torr and about 10 torr. The power source for forming etch stop layer 30B may include an HFRF power and a LFRF power. In the formation of etch stop layer 30B, the HFRF power source may provide a power between about 100 watts and about 1,000 watts, while the LFRF power source may provide a power lower than about 135 watts, and may be as low as zero watts (meaning no low-frequency power is provided). The high-frequency RF power and the LFRF power may be provided simultaneously.

Figure 7:
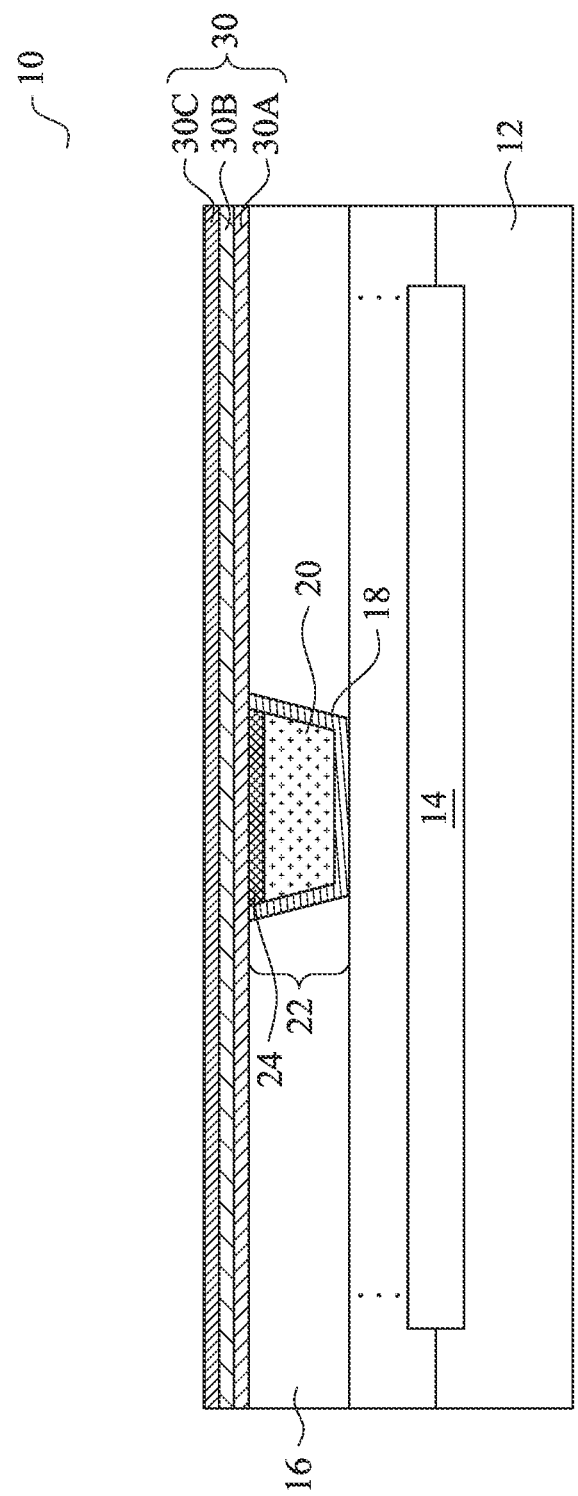
Figure 8:
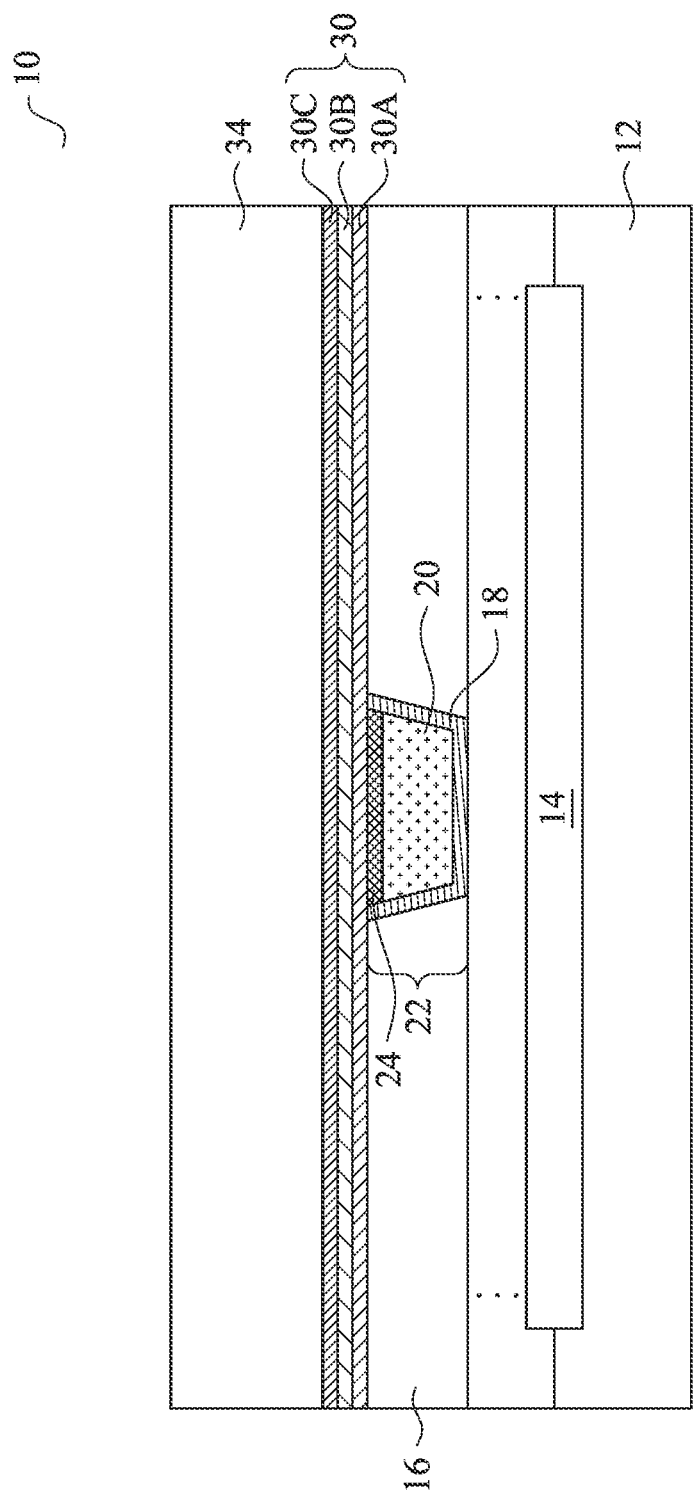

FIG. 7 illustrates the deposition of etch stop layer 30C in accordance with some embodiments. The respective process is also illustrated as process 212 in the process flow 200 as shown in FIG. 14. Etch stop layer 30C may be formed of aluminum oxide ($AlO_x$, with x being the atomic ratio of oxygen-to-aluminum). Etch stop layer 30C may also be formed of other materials that have a high etching selectivity values relative to the underlying etch stop layer 30B and overlying dielectric layer 34 (FIG. 8). The formation methods include ALD, PECVD, CVD, or the like. The thickness of etch stop layer 30C may be in the range between about 23 Å and about 50 Å. In accordance with some embodiments of the present disclosure, the precursors for forming etch stop layer 30C may include a metal-containing precursor such as TMA and an oxygen-containing precursor such as $H_2O$, $O_3$, or the like.

Each of etch stop layers 30B and 30C may have a polycrystalline structure or an amorphous structure, which may be achieved by adjusting the deposition temperature. Since the copper atoms has been blocked by the underlying cap layer 24 and etch stop layer 30A from diffusion, whether etch stop layers 30B and 30C are polycrystalline or amorphous does not affect the diffusion of copper atoms.

Throughout the description, etch stop layers 30A, 30B, and 30C are collectively and individually referred to as etch stop layer(s) 30, and etch stop layers 30A, 30B, and 30C are also referred to as the sub layers of etch stop layer 30. In accordance with some embodiments, as illustrated in FIG. 7, etch stop layer 30 includes three sub layers. In accordance with alternative embodiments of the present disclosure, etch stop layer 30 has two sub layers such as etch stop layers 30A and 30B, and does not include etch stop layer 30C. In accordance with yet alternative embodiments of the present disclosure, etch stop layer 30 is a single-layer etch stop layer including etch stop layer 30A, and does not include etch stop layers 30B and 30C.

Referring to FIG. 8, dielectric layer 34 is formed over etch stop layer 30. The respective process is illustrated as process 214 in the process flow 200 as shown in FIG. 14. Dielectric layer 34 is sometimes referred to as an IMD layer. In accordance with some embodiments of the present disclosure, dielectric layer 34 is formed of a low-k dielectric material having a k-value lower than about 3.0. Dielectric layer 34 may comprise Black Diamond (a registered trademark of Applied Materials), a carbon-containing low-k dielectric material (such as SiOC), HSQ, MSQ, or the like. In accordance with some embodiments of the present disclosure, the formation of dielectric layer 34 includes depositing a porogen-containing dielectric material, and then performing a curing process to drive out the porogen, and hence the remaining dielectric layer 34 is porous.

Figure 9:
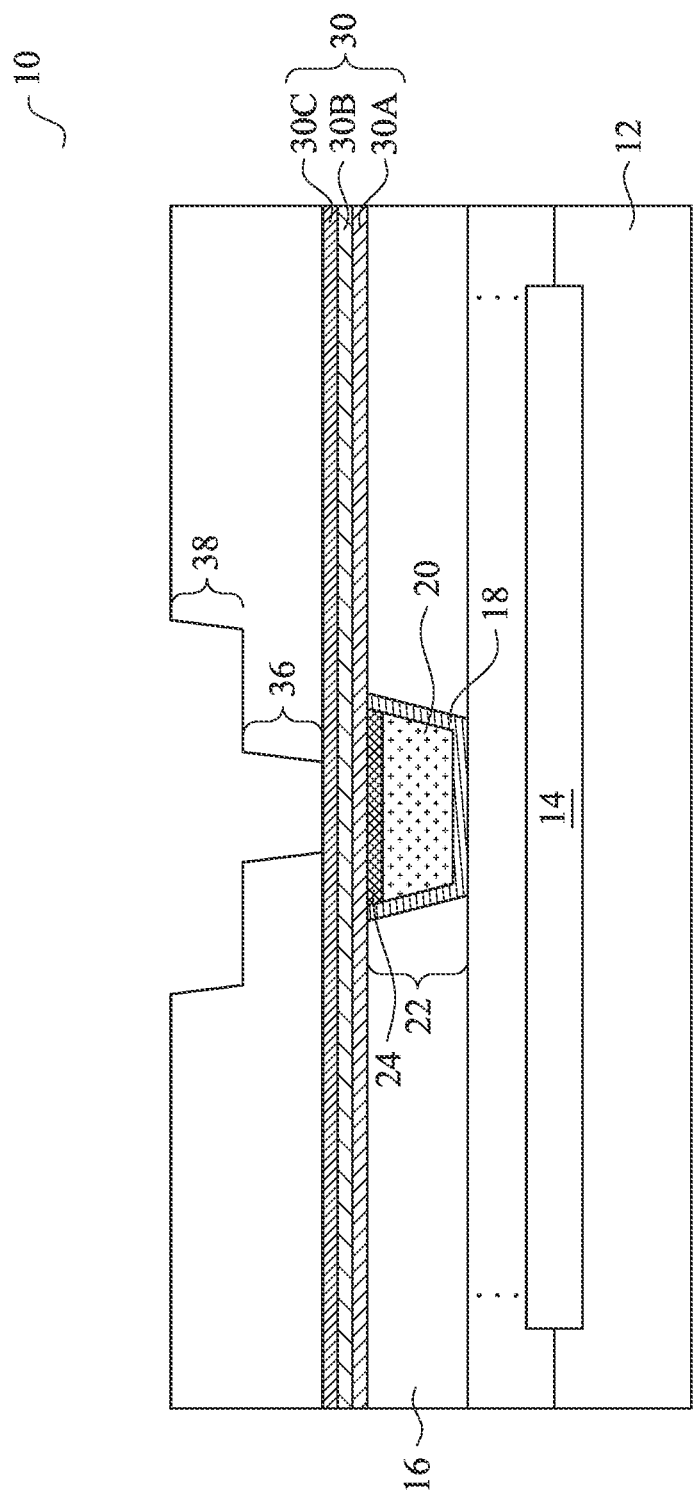

Referring to FIG. 9, trench 38 and via opening 36 are formed in dielectric layer 34. The respective process is illustrated as process 216 in the process flow 200 as shown in FIG. 14. In accordance with some embodiments of the present disclosure, the formation processes includes etching dielectric layer 34 in order to form a via opening, wherein the via opening extends from the top surface of dielectric layer 34 to an intermediate level between the top surface and the bottom surface of dielectric layer 34. Next, a metal hard mask (not shown) is formed and patterned to define the pattern of trench 38. An anisotropic etching process is then performed to etch dielectric layer 34 to form trench 38. At the same time trench 38 are formed, the via opening extends down to etch stop layer 30C, hence forming via opening 36. The etching for forming trench 38 may be performed using a time-mode. In accordance with alternative embodiments, via opening 36 and trench 38 are formed in separate photo lithography processes. For example, in a first photo lithography process, via opening 36 is formed extending to etch stop layer 30C. In a second lithography process, trench 38 is formed.

In accordance with some embodiments of the present disclosure, the etching of dielectric layer 34 is performed using a process gas comprising fluorine and carbon, wherein fluorine is used for etching, and carbon is used to generate plasma that may protect the sidewalls of the resulting via opening 36 and trench 38. With an appropriate fluorine and carbon ratio, via opening 36 and trench 38 may have desirable profiles. For example, the process gases for the etching include a fluorine-and-carbon containing gas(es) such as $C_4F_8$ and/or $CF_4$, and a carrier gas such as $N_2$.

The etching of dielectric layer 34 stops on etch stop layer 30C. Next, etch stop layer 30C is etched, for example, through a dry etching process followed by a wet etching process. In accordance with some embodiments of the present disclosure, the dry etching process is performed using etching gases such as the mixture of $BCl_3$ and $Cl_2$. The wet etching may be performed using, for example, phosphoric acid. Next, etch stop layer 30B is etched, for example, using an etching gas including a fluorine-and-carbon containing gas such as $CF_4$ and other gas(es) such as argon. The etching stops on etch stop layer 30A. Etch stop layer 30A is then etched-through, for example, using the mixture of $BCl_3$, $Cl_2$, and argon. Etch stop layer 30A may also be etched through a wet etching process using, for example, phosphoric acid. After the etching of etch stop layer 30A, cap layer 24 is revealed.

The formation of amorphous etch stop layer 30A (AlN, for example) and amorphous cap layer 24 has the advantageous feature of improving the aforementioned etching of dielectric layer 34 and etch stop layers 30A, 30B, and 30C. The amorphous structure of etch stop layer 30A and cap layer 24, which do not have grains and grain boundaries, may effectively block the copper atoms in conductive feature 22 from diffusing upwardly into etch stop layer 30 and dielectric layer 34. Otherwise, if etch stop layer 30A and cap layer 24 have polycrystalline structures, copper may diffuse along the grain boundaries into etch stop layers 30A, 30B, and 30C and the overlying dielectric layer 34. The diffused copper may reduce the etching rates in the etching of etch stop layers 30A, 30B, and 30C and dielectric layer 34. This may cause the etching for forming via opening 36 to be prematurely stopped inside etch stop layer 30 or even inside dielectric layer 34, which effect is referred to as the under-etching of etch stop layer 30 and dielectric layer 34. As a result of the under-etching, the subsequently formed via is not able to electrically connect to conductive feature 22, causing circuit failure.

Figure 10:
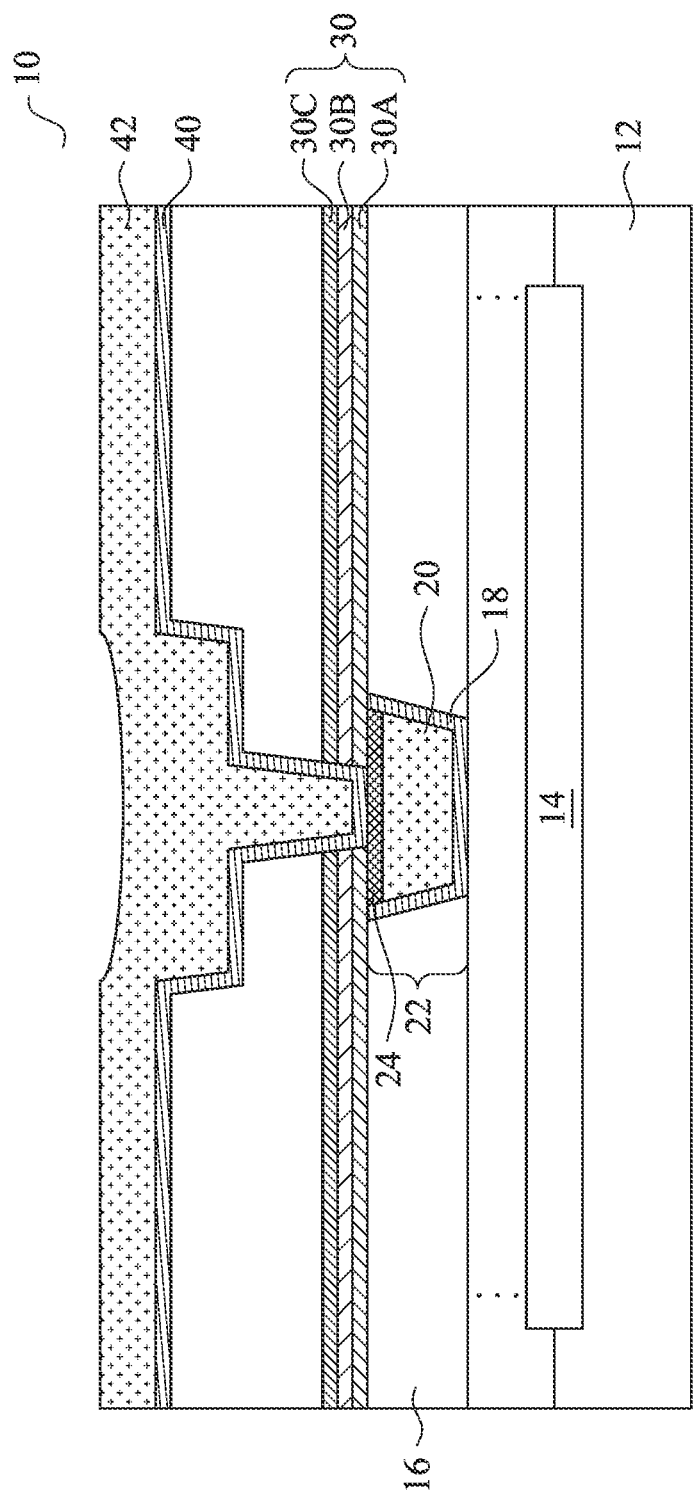

FIGS. 10 and 11 illustrate the formation of conductive via 44 in via opening 36 (FIG. 9), and conductive line 46 in trench 38. The respective process is illustrated as process 218 in the process flow 200 as shown in FIG. 14. Referring to FIG. 10, diffusion barrier layer 40, which may be formed of or comprise titanium, titanium nitride, tantalum, tantalum nitride, or other alternatives, is deposited as a blanket layer. Conductive material 42, which may be formed of copper, a copper alloy, silver, gold, tungsten, aluminum, or the like, is deposited on diffusion barrier layer 40. In accordance with some embodiments, the formation of conductive material 42 includes depositing a thin seed layer of copper or copper alloy, and filling the rest of via opening 36 and trench 38 by, for example, electro-plating, electro-less plating, deposition, or the like. A planarization process such as a Chemical Mechanical Planarization (CMP) process or a mechanical polishing process is then performed to remove excess portions of diffusion barrier 40 and conductive material 42 from the surface of dielectric layer 34. The resulting structure is shown in FIG. 11, wherein via 44 and metal line 46 are formed.

Figure 12:
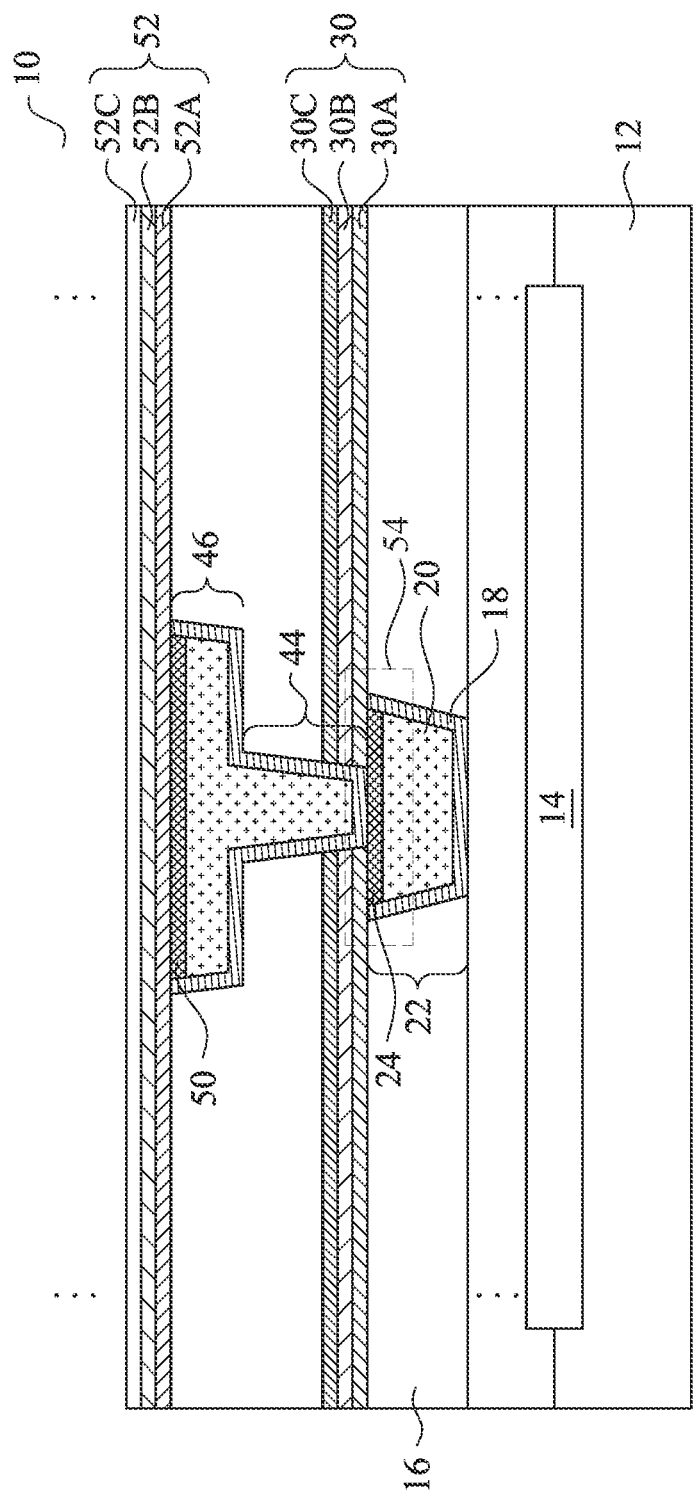

FIG. 12 illustrates the formation of additional features over metal lines 46 and dielectric layer 34. The respective process is illustrated as process 220 in the process flow 200 as shown in FIG. 14. The Additional features may include metal cap 50 and etch stop layer 52. In accordance with some embodiments, metal cap 50 is formed of a cobalt-containing material, which is formed using similar processes as the formation of cap layer 24. Accordingly, metal cap 50 may also be amorphous. Etch stop layer 52 may include sub layers 52A, 52B, and 52C, which may be formed using similar materials and similar processes as that of etch stop layers 30A, 30B, and 30C, respectively. The subsequent processes may include forming a low-k dielectric layer, and forming metal lines and vias extending into the dielectric layer and the etch stop layer 52. The details are similar to what are illustrated and discussed referring to FIGS. 8 through 11, and are not repeated herein.

In the final structure, for example, after the wafer 10 is sawed into dies and packaged, etch stop layer 30A and cap layer 24 may be amorphous in accordance with some embodiments of the present disclosure. In accordance with alternative embodiments, the processes after the formation of via 44 and metal line 46 include high-temperature processes, which may include the thermal processes with temperatures higher than about 600° C., for example. As a result, either one or both of etch stop layer 30A and cap layer 24 may be recrystallized as polycrystalline. For example, etch stop layer 30A may be amorphous, and cap layer 24 may be polycrystalline. Conversely, etch stop layer 30A may be polycrystalline, while cap layer 24 may be amorphous. The polycrystalline or amorphous structures of etch stop layer 30A and cap layer 24 are observable from Transmission electron microscopy (TEM) images.

Figure 13:
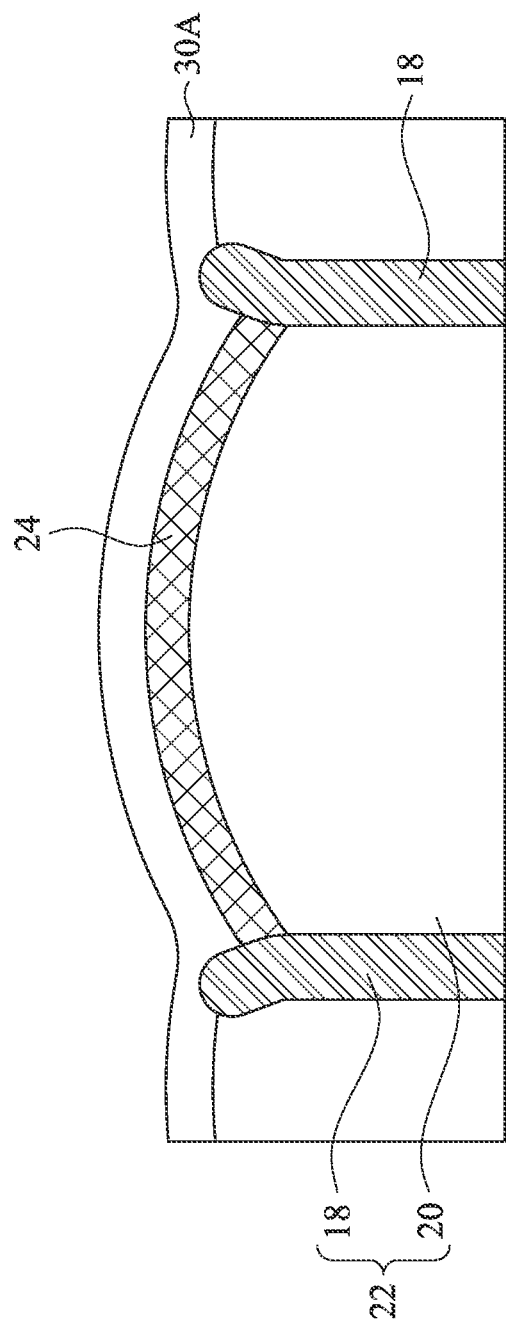
FIG. 13 illustrates an example profile of a portion of an interconnect structure in accordance with some embodiments.

FIG. 13 illustrates a TEM image of a portion 54 in FIG. 12. Via 44 is not illustrated. In accordance with some embodiments, cap layer 24 is curved, and contacts the top surface of copper-containing material 20. Cap layer 24 is located between the vertical portions of barrier layer 18. The top surface of cap layer 24 may join the inner sidewalls of barrier layer 18 at positions lower than the top ends of barrier layer 18. Etch stop layer 30A may curve up over the top ends of barrier layer 18.

Experiments are performed to analyze AlN films (etch stop layer 30A). The experiment results indicate that the bombardment (treatment process 32 in FIG. 5) also improve the quality of the AlN, which contributes to the diffusion-blocking ability of the AlN films. For example, a first sample AlN film and a second sample AlN film are made in the experiments. The first sample AlN film is bombarded with an LFRF power of 250 watts, and the second sample AlN film is bombarded with an LFRF power of 350 watts. The densities of the first sample film and the second sample film are then measured. The results revealed that the density of the first sample film is lower than the density of the second sample film. Accordingly, the experiment results indicate that a higher bombarding energy may cause the AlN films to be denser, and correspondingly, their diffusion-blocking ability for blocking copper from diffusing-through is improved. It is noted that at the time the AlN films were measured, since the samples are exposed to oxygen, the AlN samples are actually oxidized as AlON films. The measure from AlON films rather than AlN films, however, does not affect the conclusion that bombardment may result in the improvement in the density of AlN films.

The embodiments of the present disclosure have some advantageous features. By forming amorphous etch stop layers and amorphous metal caps, since there are no grain boundaries for copper atoms to migrate-through, the copper atoms are blocked from being diffused into the overlying etch stop layers and low-k dielectric layers. Since the copper atoms may cause the under-etching of the low-k dielectric layers and etch stop layers, the blocking of copper diffusion eliminates the under-etching, and the manufacturing yield is improved.

In accordance with some embodiments of the present disclosure, a method includes depositing a first etch stop layer over a first conductive feature; performing a first treatment to amorphize the first etch stop layer; depositing a dielectric layer over the first etch stop layer; etching the dielectric layer to form an opening; etching-through the first etch stop layer to extend the opening into the first etch stop layer; and filling the opening with a conductive material to form a second conductive feature. In an embodiment, the first treatment comprises bombarding the first etch stop layer using a process gas comprising ammonia ($NH_3$). In an embodiment, the first treatment is performed using a low-frequency radio-frequency power in a range between about 90 watts and about 135 watts. In an embodiment, the depositing the first etch stop layer is performed at a temperature in a range between about 300° C. and about 380° C. In an embodiment, the method further includes forming an amorphous metal cap, wherein the amorphous metal cap is over the first conductive feature and underlying the first etch stop layer. In an embodiment, the forming the amorphous metal cap comprises depositing a metal cap; and after the metal cap is deposited, bombarding the metal cap to generate amorphous structures in the metal cap. In an embodiment, after the second conductive feature is formed, a high-temperature process is performed, wherein the first etch stop layer is converted to have polycrystalline structures. In an embodiment, the method further includes depositing a second etch stop layer over the first etch stop layer; and depositing a third etch stop layer over the second etch stop layer, wherein the dielectric layer is formed over the third etch stop layer, and the opening further extends through the third etch stop layer and the second etch stop layer.

In accordance with some embodiments of the present disclosure, an integrated circuit structure includes a first dielectric layer; a first conductive feature extending into the first dielectric layer; a metal cap over and contacting the first conductive feature; an amorphous first etch stop layer over the metal cap; a low-k dielectric layer over the amorphous first etch stop layer; and a second conductive feature extending into the low-k dielectric layer and the amorphous first etch stop layer. In an embodiment, the amorphous first etch stop layer comprises an amorphous aluminum nitride layer. In an embodiment, the amorphous aluminum nitride layer comprises hydrogen therein. In an embodiment, the amorphous first etch stop layer contacts the metal cap. In an embodiment, the metal cap is amorphous. In an embodiment, the metal cap comprises cobalt nitride. In an embodiment, the integrated circuit structure further comprises a second etch stop layer over the amorphous first etch stop layer; and a third etch stop layer over the second etch stop layer, wherein the second conductive feature penetrates through the second etch stop layer and the third etch stop layer to contact the metal cap.

In accordance with some embodiments of the present disclosure, an integrated circuit structure includes a first low-k dielectric layer; a first conductive feature extending into the first low-k dielectric layer, wherein the first conductive feature comprises copper; a metal cap over and contacting the first conductive feature; and an etch stop layer. The etch stop layer includes an amorphous aluminum nitride layer over and contacting the metal cap and the first low-k dielectric layer, wherein the amorphous aluminum nitride layer forms a first sub etch stop layer; a second sub etch stop layer over the first sub etch stop layer; and a third sub etch stop layer over the second sub etch stop layer; a second low-k dielectric layer over the third sub etch stop layer; and a conductive via extending into the second low-k dielectric layer and the etch stop layer. In an embodiment, the metal cap is amorphous. In an embodiment, the metal cap has a thickness in a range between about 20 Å and about 40 Å. In an embodiment, the metal cap comprises cobalt nitride. In an embodiment, the second sub etch stop layer comprises silicon carbo-oxide, and the third sub etch stop layer comprises aluminum oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    depositing a first etch stop layer over a first conductive feature;
    performing a first treatment to amorphize the first etch stop layer;
    depositing a dielectric layer over the first etch stop layer;
    etching the dielectric layer to form an opening;
    etching-through the first etch stop layer to extend the opening into the first etch stop layer; and
    filling the opening with a conductive material to form a second conductive feature.

2. The method of claim 1, wherein the first treatment comprises bombarding the first etch stop layer using a process gas comprising ammonia ($NH_3$).

3. The method of claim 2, wherein the first treatment is performed using a low-frequency radio-frequency power in a range between about 90 watts and about 135 watts.

4. The method of claim 1, wherein the depositing the first etch stop layer is performed at a temperature in a range between about 300° C. and about 380° C.

5. The method of claim 1 further comprising forming an amorphous metal cap, wherein the amorphous metal cap is over the first conductive feature and underlying the first etch stop layer.

6. The method of claim 5, wherein the forming the amorphous metal cap comprises:
    depositing a metal cap; and
    after the metal cap is deposited, bombarding the metal cap to generate amorphous structures in the metal cap.

7. The method of claim 1 further comprising, after the second conductive feature is formed, performing a high-temperature process, wherein the first etch stop layer is converted to have polycrystalline structures.

8. The method of claim 1 further comprising:
    depositing a second etch stop layer over the first etch stop layer; and
    depositing a third etch stop layer over the second etch stop layer, wherein the dielectric layer is formed over the third etch stop layer, and the opening further extends through the third etch stop layer and the second etch stop layer.

9. An integrated circuit structure comprising:
    a first dielectric layer;
    a first conductive feature extending into the first dielectric layer;
    a metal cap over and contacting the first conductive feature, wherein the metal cap is amorphous;
    an amorphous first etch stop layer over the metal cap;
    a low-k dielectric layer over the amorphous first etch stop layer; and
    a second conductive feature extending into the low-k dielectric layer and the amorphous first etch stop layer.

10. The integrated circuit structure of claim 9, wherein the amorphous first etch stop layer comprises an amorphous aluminum nitride layer.

11. The integrated circuit structure of claim 10, wherein the amorphous aluminum nitride layer comprises hydrogen therein.

12. The integrated circuit structure of claim 9, wherein the amorphous first etch stop layer contacts the metal cap.

13. The integrated circuit structure of claim 9, wherein the metal cap comprises nitrogen.

14. The integrated circuit structure of claim 9, wherein the metal cap comprises cobalt nitride.

15. The integrated circuit structure of claim 9 further comprising:
    a second etch stop layer over the amorphous first etch stop layer; and
    a third etch stop layer over the second etch stop layer, wherein the second conductive feature penetrates through the second etch stop layer and the third etch stop layer to contact the metal cap.

16. An integrated circuit structure comprising:
    a first low-k dielectric layer;
    a first conductive feature extending into the first low-k dielectric layer, wherein the first conductive feature comprises copper;
    a metal cap over and contacting the first conductive feature;
    an etch stop layer comprising:
        an amorphous aluminum nitride layer over and contacting the metal cap and the first low-k dielectric layer, wherein the amorphous aluminum nitride layer forms a first sub etch stop layer;
        a second sub etch stop layer over the first sub etch stop layer; and
        a third sub etch stop layer over the second sub etch stop layer;
    a second low-k dielectric layer over the third sub etch stop layer; and
    a conductive via extending into the second low-k dielectric layer and the etch stop layer.

17. The integrated circuit structure of claim 16, wherein the metal cap is amorphous.

18. The integrated circuit structure of claim 16, wherein the metal cap has a thickness in a range between about 20 Å and about 40 Å.

19. The integrated circuit structure of claim 16, wherein the metal cap comprises cobalt nitride.

20. The integrated circuit structure of claim 16, wherein the second sub etch stop layer comprises silicon carbo-oxide, and the third sub etch stop layer comprises aluminum oxide.

* * * * *